(12) United States Patent
Pakala et al.

(10) Patent No.: US 7,098,494 B2
(45) Date of Patent: Aug. 29, 2006

(54) RE-CONFIGURABLE LOGIC ELEMENTS USING HEAT ASSISTED MAGNETIC TUNNELING ELEMENTS

(75) Inventors: Mahendra Pakala, Fremont, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 40 days.

(21) Appl. No.: 10/869,734

(22) Filed: Jun. 16, 2004

(65) Prior Publication Data

US 2005/0280058 A1    Dec. 22, 2005

(51) Int. Cl.
 *H01L 31/062*    (2006.01)
(52) U.S. Cl. .................. 257/295; 257/421; 365/158
(58) Field of Classification Search .............. None
See application file for complete search history.

(56) References Cited

U.S. PATENT DOCUMENTS

| | | | |
|---|---|---|---|
| 6,774,391 B1 * | 8/2004 | Cowburn | 257/24 |
| 6,914,807 B1 * | 7/2005 | Nakamura et al. | 365/158 |
| 2003/0227807 A1 | 12/2003 | Nakamura et al. | |
| 2005/0128801 A1 * | 6/2005 | Nickel et al. | 365/171 |

OTHER PUBLICATIONS

A. Ney, et al., "Programmable computing with a single magnetoresistive element", Letters to Nature, vol. 425 (2003), pp. 485-487.

R. Richter, et al., *Field programmable spin-logic based on magnetic tunnelling elements'*, Journal of Magnetism and Magnetic Materials, vol. 240 (2002), pp. 127-129.

W. Black and B. Das, *Programmable logic using giant-magnetoresistance and spin-dependent tunneling devices (invited)*, Journal of Applied Physics, vol. 87 (2000), pp. 6674-6679.

G. Anderson, et al. *CoFe/IrMn exchange biased top, bottom, and dual spin valves*, Journal of Applied Physics, vol. 87, No. 9, May 2000, pp. 6989-6991.

* cited by examiner

*Primary Examiner*—Tu-Tu Ho
(74) *Attorney, Agent, or Firm*—Sawyer Law Group LLP

(57) ABSTRACT

A magnetic logic cell includes a magnetic element having a pinned layer, a free layer, and a spacer layer. The pinned and free layers have pinned and free layer magnetizations. The spacer layer resides between the pinned and free layers. In one aspect, the magnetic logic cell includes a first configuration line that is electrically connected to the magnetic element and carries a first current and a second configuration line electrically that is insulated from the magnetic element and the first configuration line and carries a second current. The first or second current alone cannot switch the free layer magnetization. The first and second currents together can switch the free layer magnetization. When the first current is driven through the magnetic element and the second current is provided, the combination sets the pinned layer magnetization direction. In one aspect, the pinned layer magnetization is set by heating the AFM layer to approximately at or above the blocking temperature. In order to configure the logic cell, an initial direction for the free layer magnetization is also set.

24 Claims, 5 Drawing Sheets

RE-CONFIGURABLE LOGIC ELEMENTS USING HEAT ASSISTED MAGNETIC TUNNELING ELEMENTS

FIELD OF THE INVENTION

The present invention relates to electronic logic devices and more particularly to a method and system for providing a magnetic element that is suitable for use in logic applications such as AND, OR, NAND, and NOR gates.

BACKGROUND OF THE INVENTION

Currently, magnetic elements are of interest for a variety of applications. In general, such conventional magnetic elements are magnetic tunneling junctions. FIG. 1 depicts such a conventional magnetic element 10. The conventional magnetic element 10 includes a conventional antiferromagnetic (AFM) layer 12, a conventional pinned layer 14, a conventional tunneling barrier layer 16, and a conventional free layer 18. Other layers (not shown), seed, and/or capping layers may also be used. The conventional pinned layer 14 and the conventional free layer 18 are ferromagnetic. Thus, the conventional free layer 18 is depicted as having a changeable magnetization 19. The nonmagnetic tunneling barrier layer 16 is typically an insulator. The magnetization 15 of the pinned layer 14 is pinned in a particular direction by the AFM layer 12. The magnetization 19 of the free layer 18 is free to rotate, typically in response to an external magnetic field.

Depending upon the orientations of the magnetization 19 and 15 of the conventional free layer 18 and the conventional pinned layer 14, respectively, the resistance of the conventional magnetic element 10, respectively, changes. When the magnetization 19 of the conventional free layer 18 is parallel to the magnetization 15 of the conventional pinned layer 14, the resistance of the conventional magnetic element 10 is low. When the magnetization 19 of the conventional free layer 18 is antiparallel to the magnetization 15 of the conventional pinned layer 14, the resistance of the conventional magnetic element 10 is high. To sense the resistance of the conventional magnetic element 10, current is driven through the conventional magnetic element 10. Current could be driven in a CPP (current perpendicular to the plane) configuration, perpendicular to the layers of conventional magnetic element 10 up or down, in the z-direction as seen in FIG. 1. Based upon the output, it can be determined whether the resistance of the conventional magnetic element 10 is high or low. When the magnetic element is used for logic application, typically a high resistance state (free layer magnetization 19 antiparallel to the pinned layer magnetization 15) corresponds to a logical zero, "0". A low resistance state (free layer magnetization 19 parallel to the pinned layer magnetization 15) corresponds to a logical one, "1".

One application that is of interest is the use of the conventional magnetic element 10 in reconfigurable structures that perform multiple logic operations such as AND, OR, NAND, and NOR functions. Logic functions are traditionally performed using conventional transistor based logic. Conventional transistor based logic circuits are designed to perform one logic operation per design. Thus, the transistor based logic cells cannot be reconfigured to perform alternate operations. It would, therefore, be desirable to perform such logic operations using reconfigurable technology, such as magnetic technology.

Although conventional magnetic elements, such as the conventional magnetic element 10, can be used in reconfigurable logic design, one of ordinary skill in the art will readily recognize that current designs have serious drawbacks. For example, most conventional reconfigurable logic designs using the conventional magnetic element 10 require multiple conventional magnetic elements 10 per cell. See, for example, R. Richter, H. Boeve, L. Bar, J. Bangert, U. K. Klostermann, J. Wecker and G. Reiss, "*Field programmable spin-logic based on magnetic tunneling elements*" in Journal of Magnetism and Magnetic Materials, vol. 240 (2002) pp 127–129 or W. Black and B. Das, "*Programmable logic using giant-magnetoresistance and spin-dependant tunneling devices*" in Journal of Applied Physics, vol. 87 (2000) pp 6674–6679. Alternatively, other conventional reconfigurable logic designs that utilize conventional magnetic elements 10 involve complex interconnection architectures. See, for example, S. Nakamura and S. Haneda, "*Magnetic logic element and magnetic logic element array*", U.S. Patent Publ. # 2003/0227807 or A. Ney, C. Pampuch, R. Koch and K. H. Ploog, "*Programmable computing with a single magnetoresistive element*" in Letter to Nature, vol. 425 (2003) pp 485–487. Multiple conventional magnetic elements 10 per cell and complex interconnection architectures are a barrier to using magnetic elements in higher density, relatively easily fabricated reconfigurable logic circuits.

Accordingly, what is needed is a method and system for providing reconfigurable logic that utilizes magnetic elements while maintaining a simpler structure. The present invention addresses such a need.

BRIEF SUMMARY OF THE INVENTION

The present invention provides a magnetic logic cell that includes a magnetic element having a pinned layer, a free layer, and a spacer layer. The pinned layer has a pinned layer magnetization. The free layer has a free layer magnetization. The spacer layer resides between the pinned layer and the free layer. A first configuration line is electrically connected to the magnetic element and carries a first current. A second configuration line is electrically insulated from the magnetic element and from the first configuration line. The second configuration line carries a second current. The first current and the second current alone are incapable of switching the free layer magnetization. The first current and the second current together in a particular direction can switch the free layer magnetization to the particular direction. When the first current is driven through the magnetic element and the second current is provided, the combination is capable of setting the pinned layer magnetization to a pinned layer magnetization direction. In order to configure the logic cell to perform a specific logic operation, the pinned layer magnetization direction is set as described above. An initial direction for the free layer magnetization is also set by driving the first current and the second current.

According to the method and system disclosed herein, the present invention provides reconfigurable logic that can utilize a single magnetic element per operation. Once configured, the logic cell can accept inputs and provide the appropriate output for the logic operation based upon the inputs.

DETAILED DESCRIPTION OF THE INVENTION

Figure 1:
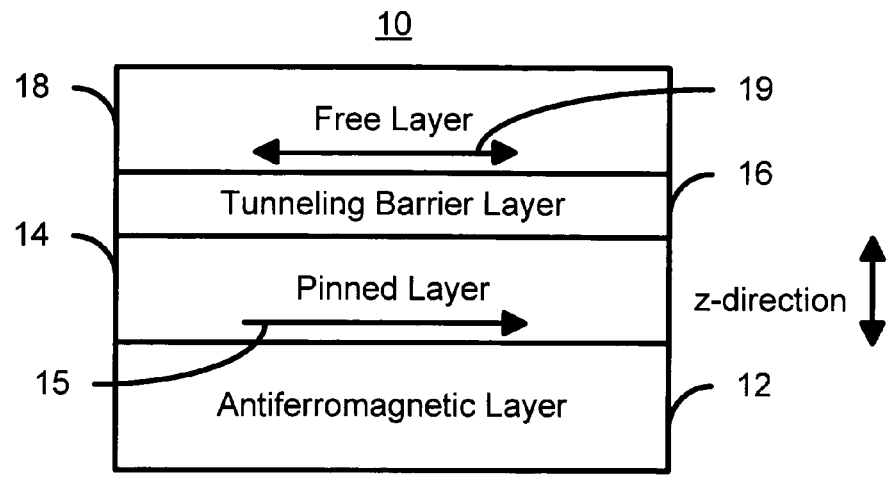
FIG. 1 is a diagram of a conventional magnetic element, a spin tunneling junction.

The present invention relates to logic design. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a magnetic logic cell that includes a magnetic element having a pinned layer, a free layer, and a spacer layer. The pinned layer has a pinned layer magnetization. The free layer has a free layer magnetization. The spacer layer resides between the pinned layer and the free layer. A first configuration line is electrically connected to the magnetic element and carries a first current. A second configuration line electrically is insulated from the magnetic element and from the first configuration line. The second configuration line carries a second current. The first current and the second current alone are incapable of switching the free layer magnetization. The first current and the second current together in a particular direction can switch the free layer magnetization to the particular direction. When the first current is driven through the magnetic element and the second current is provided, the combination is capable of setting the pinned layer magnetization to a pinned layer magnetization direction. In order to configure the logic cell to perform a specific logic operation, the pinned layer magnetization direction is set as described above. An initial direction for the free layer magnetization is also set by driving the first current and the second current.

The present invention will be described in terms of a particular magnetic element having certain components. However, one of ordinary skill in the art will readily recognize that this method and system will operate effectively for other magnetic logic elements having different and/or additional components and other magnetic logic having different and/or other features not inconsistent with the present invention. The present invention is also described in the context of current understanding of the magnetic switching. Consequently, one of ordinary skill in the art will readily recognize that theoretical explanations of the behavior of the method and system are made based upon this current understanding of magnetic switching. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of certain structures, such as magnetic tunneling junctions. However, one of ordinary skill in the art will readily recognize that the present invention is not limited to such structures, but instead can be used in other structures not inconsistent with the present invention. Moreover, the present invention is described in the context of the magnetic element. However, one of ordinary skill in the art will readily recognize that when incorporated into logic cell arrays, the magnetic element may be combined with another component, such as a transistor. The method and system are also described in the context of the current knowledge of ballistic MR. However, this description is not intended to limit the scope of the present invention.

Figure 2:
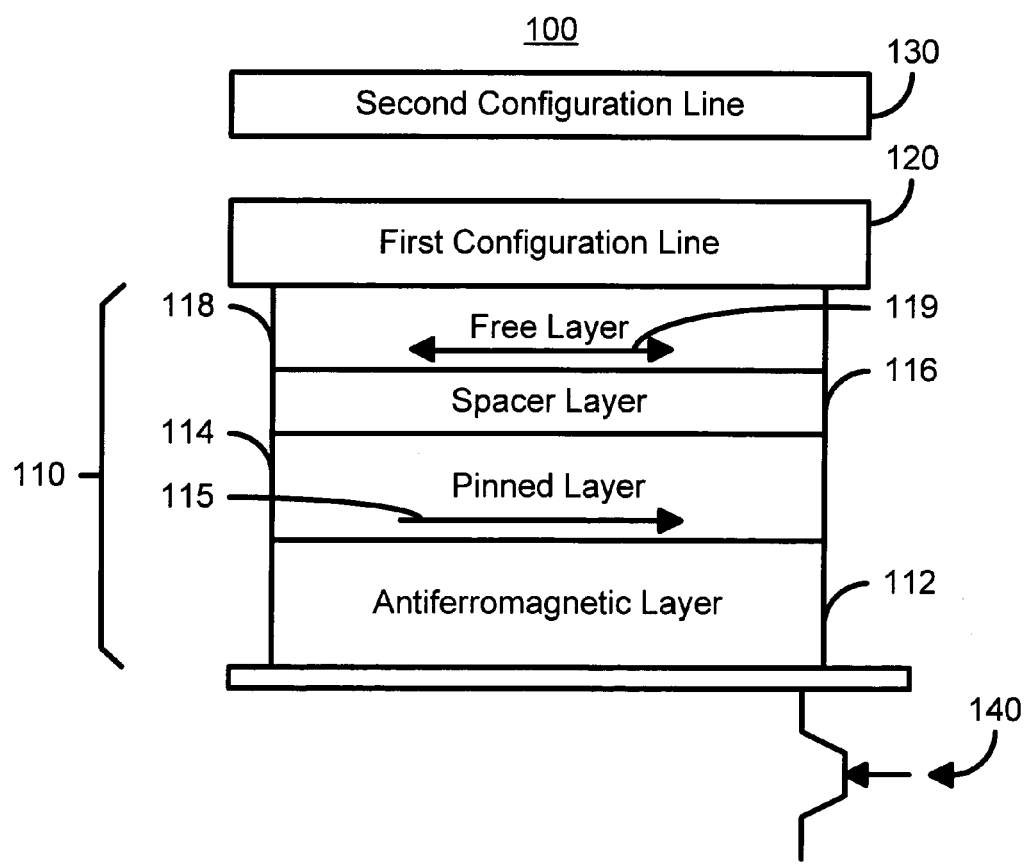
FIG. 2 is a diagram depicting one embodiment of a reconfigurable magnetic logic cell in accordance with the present invention.

To more particularly illustrate the method and system in accordance with the present invention, refer to FIG. 2, depicting one embodiment of a reconfigurable magnetic logic cell 100 in accordance with the present invention. In general, the magnetic logic cell 100 includes a magnetic element 100, first configuration line 120, and second configuration line 130. The first configuration line 120 is preferably electrically coupled to the magnetic element 110. The configuration lines 120 and 130 preferably carry current substantially perpendicular to the page as shown in FIG. 2. In addition to carrying currents for configuring the logical operation performed by the logic cell 100, as described below, the configuration lines 120 and 130 carry the inputs during operation of the magnetic logic cell 100. The transistor 140 selectively allows current to flow through the magnetic element 110. For example, the transistor 140 may be turned on during reading or, as is described below, when the direction of the pinned layer magnetization 115 is set.

The magnetic element 110 includes an AFM layer 112, a pinned layer 114 having a pinned layer magnetization 115, a spacer layer 116 and a free layer 118 having a free layer magnetization 119. In one embodiment, the free layer 118 is a magnetic alloy containing at least one of elements Co, Fe or Ni. In a preferred embodiment, the free layer 118 includes Co, CoFe, CoFeB or a bilayer of type NiFe/CoFe. In one embodiment, the pinned layer 114 is a magnetic alloy containing at least one of elements Co, Fe or Ni. In a preferred embodiment, the pinned layer 114 includes Co or CoFe. The pinned layer 114 could also be synthetic, for example including ferromagnetic layers separated by a non-magnetic spacer layer. In such an embodiment, the pinned layer 114 could be CoFe/Ru/CoFe.

The spacer layer 116 is preferably a nonmagnetic tunneling barrier layer or a current confined layer. If the spacer layer 116 is a tunneling barrier layer, then the spacer layer 116 preferably includes alumina or MgO and has a thickness of less than two nanometers. If the spacer layer 116 is a current confined layer, then the magnetic element 110 is preferably a ballistic magnetoresistive element. In such an embodiment, the spacer layer 116 includes a ferromagnetic alloy containing at least one of the elements Co, Fe or Ni embedded in an insulating matrix, such as $SiO_2$ or SiC. In such an embodiment, the ferromagnetic material forms channel(s) extending through the vertical length of the spacer layer 116. The channel width is preferably between one and three nanometers and has a length (approximately the same as thickness of the spacer layer 116) that allows ballistic transport of electrons. In such an embodiment, the channel also serves as site for location of sharp domain wall when the magnetization directions of the layer at its two ends are anti-parallel.

The magnetic element 110 also preferably includes an AFM layer 112. The AFM layer preferably has a low blocking temperature in the range of one hundred degrees Celsius to two hundred degrees Celsius. For example, the AFM layer 112 may include materials including but not limited to IrMn and FeMn. Preferably the AFM layer 112 has a composition is close to $Ir_{20}Mn_{80}$ with blocking temperature of between one hundred and two hundred degrees Celsius, and preferably about one hundred and fifty degrees Celsius. The thickness and composition of the AFM layer 112 may be varied to obtain the desired blocking temperature.

The logic function provided by the magnetic logic cell 100 is reconfigurable and depends upon the currents driven through the configuration lines 120 and 130. For clarity, directions of magnetization and logic states are defined as follows. A logical zero "0" output occurs for a high resistance state (magnetizations 115 and 119 antiparallel) of the magnetic element 110. A logical one "1" output corresponds to a low resistance state (magnetizations 115 and 119 parallel) of the magnetic element 110. A positive direction for a magnetization is defined as toward the right in FIG. 2, while a negative direction is to the left in FIG. 2. A positive current in the configuration lines 120 and 130 is one which generates a magnetic field at the magnetic element 110 in the positive direction (left to right). A negative current in the configuration lines 120 and 130 is one which generates a magnetic field at the magnetic element 110 in the negative direction (left to right).

In operation, the first configuration line 120 and the second configuration line 130 carry a first current and a second current, respectively. To switch the pinned layer magnetization, the first current of configuration line 120 is passed through the magnetic element, thus heating the element close to or above the blocking temperature of the AFM material 112. Simultaneously the second current is passed through the line 130, in either a positive or negative direction, to set the pinned layer magnetization along either the positive or negative direction respectively. To switch the free layer, both the first and second current travel through the line above the element, i.e., first current does not go through the magnetic element. The first and second currents alone are insufficient to switch the magnetization 119 of the free layer 118. However, when both the first and second currents are either in a positive direction or a negative direction, the free layer magnetization 119 is switched to a positive direction or a negative direction, respectively. The first and second currents are thus used in configuring the logic operation of the magnetic logic cell 100. In addition, the first and second currents are used as two inputs during operation of the magnetic logic cell. In particular, a positive first current corresponds to one input to the logic cell, with the input value being a logical "1". A negative first current corresponds to the first input value being a logical "0". Similarly, a positive second current corresponds to the other input to the logic cell having the input value being a logical "1". A negative second current corresponds to the other input of the logic cell being a logical "0".

The magnetic logic cell 100 could perform a number of logical operations. Described herein are the AND, OR, NAND, and NOR operations. For an AND operation, the pinned layer magnetization 115 is set in the positive direction, and the free layer magnetization 119 is initially set antiparallel to the pinned layer magnetization. Thus, the initial state of the logical cell 100 would be a logical "0". The magnetic logic cell 100 is then ready to receive inputs. If the first and second inputs are both "1", corresponding to the first current and a second current, respectively, being in the positive direction, then the direction of the free layer magnetization 119 would be switched. If the first input is "0" (the first current in the negative direction), the second input is "0" (the second current in the negative direction), or both are "0" (first and second currents in the negative direction), the magnetic field generate will not switch the magnetization 119 of the free layer 118.

For an OR operation, the pinned layer magnetization 115 is set in the positive direction, and the free layer magnetization 119 is initially set parallel to the pinned layer magnetization. Thus, the initial state of the logical cell 100 would be a logical "1". The magnetic logic cell 100 is then ready to receive inputs. If the first and second inputs are both "0", corresponding to the first current and a second current, respectively, being in the negative direction, then the direction of the free layer magnetization 119 would be switched. If the first input is "1" (the first current in the positive direction), the second input is "1" (the second current in the positive direction), or both are "1" (first and second currents in positive negative direction), the magnetic field generate will not switch the magnetization 119 of the free layer 118.

For a NOR operation, the pinned layer magnetization 115 is set in the negative direction, and the free layer magnetization 119 is initially set antiparallel to the pinned layer magnetization. Thus, the initial state of the logical cell 100 would be a logical "0". The magnetic logic cell 100 is then ready to receive inputs. If the first and second inputs are both "0", corresponding to the first current and a second current, respectively, being in the negative direction, then the direction of the free layer magnetization 119 would be switched (to a logical 1). If the first input is "1" (the first current in the positive direction), the second input is "1" (the second current in the positive direction), or both are "1" (first and second currents in the positive direction), the magnetic field generate will not switch the magnetization 119 of the free layer 118.

For a NAND operation, the pinned layer magnetization 115 is set in the negative direction, and the free layer magnetization 119 is initially set parallel to the pinned layer magnetization. Thus, the initial state of the logical cell 100 would be a logical "1". The magnetic logic cell 100 is then ready to receive inputs. If the first and second inputs are both "1", corresponding to the first current and a second current, respectively, being in the positive direction, then the direction of the free layer magnetization 119 would be switched to logical "0". If the first input is "0" (the first current in the negative direction), the second input is "0" (the second current in the negative direction), or both are "0" (first and second currents in the negative direction), the magnetic field generate will not switch the magnetization 119 of the free layer 118. Configuration of the magnetic logic cell 100 is described in conjunction with FIGS. 3–6.

Thus, the magnetic logic cell 100 can be configured (and reconfigured) to provide a number of different logic operations. Furthermore, configuring the magnetic logic cell 100 can be achieved simply by driving the appropriate currents through and in proximity to portions of the magnetic memory. In addition to being reconfigurable, the magnetic logic cell 100 uses only one magnetic element per cell. Consequently, density can be improved and manufacturing simplified. Table 1 depicts the input currents and their corresponding logical state as well as the output for specific logic functions.

| Input A (1st Config. Line) | Input B (2nd Config. Line) | Output AND Operation | Output OR Operation | Output NOR Operation | Output NAND Operation |
| --- | --- | --- | --- | --- | --- |
| 0 (−I1) | 0 (−I2) | 0 | 0 | 1 | 1 |
| 0 (−I1) | 1 (+I2) | 0 | 1 | 0 | 1 |
| 1 (+I1) | 0 (−I2) | 0 | 1 | 0 | 1 |
| 1 (+I1) | 1 (+I2) | 1 | 1 | 0 | 0 |

In order to read the output of the magnetic logic cell 100, a read current is driven through the magnetic element 110 and the resistance state determined. In a preferred embodiment, this reading is accomplished by turning the transistor 140 on so that current can be driven through the magnetic element 110. In a preferred embodiment, the first configuration line 120 also provides the read current. In a preferred embodiment, the read current is substantially less than the first current used in configuring the magnetic logic cell 100 or for the inputs. This is to ensure that the read operation does not disturb the state of the free layer 118.

Figure 3:
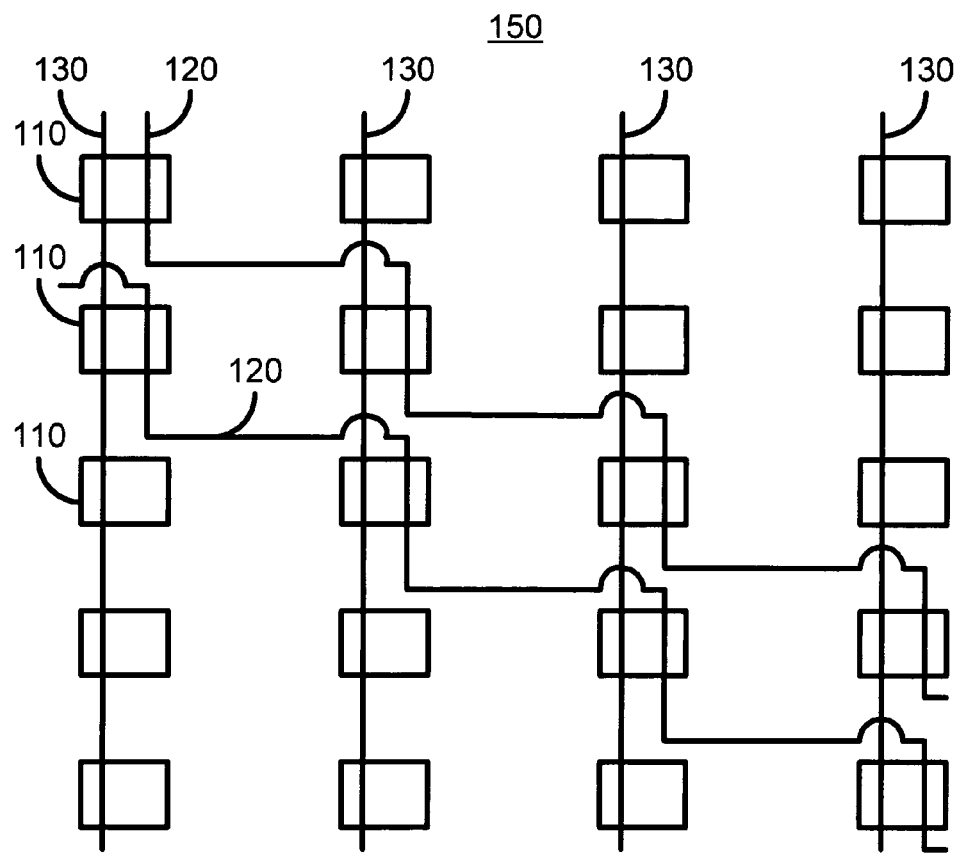
FIG. 3 is a diagram depicting one embodiment of a reconfigurable magnetic array in accordance with the present invention.

FIG. 3 is a diagram depicting one embodiment 150 of a reconfigurable magnetic logic array in accordance with the present invention. The reconfigurable magnetic logic array 150 includes a number of magnetic elements 110. Also shown are first configuration lines 120 and second configuration lines 130. Because of the configuration shown, each magnetic element 110 can be separately programmed. Thus, in the embodiment shown, any particular pair of configuration lines 120 and 130 are parallel to each other only on top of exactly one magnetic element 110. As a result, the benefits of the magnetic element 100 are achieved in a memory 150. Other configurations which provide separate programming of each magnetic element can be also used.

Figure 4:
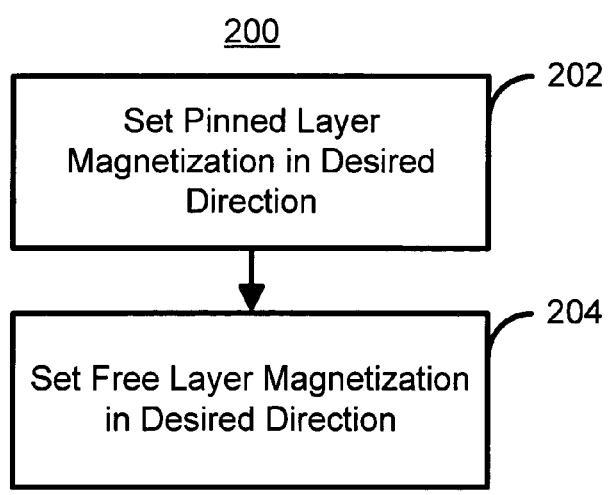
FIG. 4 is a high-level flow chart depicting one embodiment of a method in accordance with the present invention for configuring a magnetic logic cell for a particular operation

FIG. 4 is a high-level flow chart depicting one embodiment of a method in accordance with the present invention 200 for configuring a magnetic logic cell for a particular logic operation. For clarity, the method 200 is described in the context of the magnetic logic cell 100. However, nothing prevents the use of the method 200 with another magnetic logic cell. The magnetization 115 of the pinned layer 114 is set in the desired direction, via step 202. Note that step 202 in general involves a two stage process to be done in particular order: the first involves heating the element in a magnetic field, followed immediately by a second stage of cooling in a magnetic field. Thus, the magnetization 115 is set to be either positive or negative, depending upon the logic operation desired. Note that as used herein, setting the direction of magnetization when configuring the magnetic logic cell could include switching the magnetization direction or simply leaving the magnetization direction at a previous state. When switching the magnetization 115 of the pinned layer 114 to configure logic cell 100 in step 202, a current is preferably driven through the magnetic element 110. In a preferred embodiment, the first current is driven through the magnetic element 110 by turning the transistor 140 on (for example by inputting current I3) and driving the first current from the first configuration line 120 through the magnetic element 110. This first current preferably heats the AFM layer 112 to above its blocking temperature. Note that another heating mechanism might be used. A magnetic field in the desired direction is provided on the pinned layer 114 while the AFM layer 112 is above its blocking temperature. Preferably, this magnetic field is provided by the second current driven through the second configuration line 140. For example, if the magnetization 115 of the pinned layer 114 is desired in the negative direction, the second current is preferably driven in the negative direction. Also in step 202, the magnetic element 110 is cooled in the presence of the magnetic field. Once well below the blocking temperature of the AFM layer 110, the magnetization 115 of the pinned layer is in the desired direction. The direction of the magnetization 119 of the free layer 118 is also set, via step 204. In a preferred embodiment, step 204 is performed by driving the first and second currents both in the positive direction or both in the negative direction. Thus, the magnetization 115 of the pinned layer 114 and the initial magnetization 119 of the free layer 118 are set in the desired manner. Consequently, the magnetic cell 100 can be configured as desired.

Figure 5:
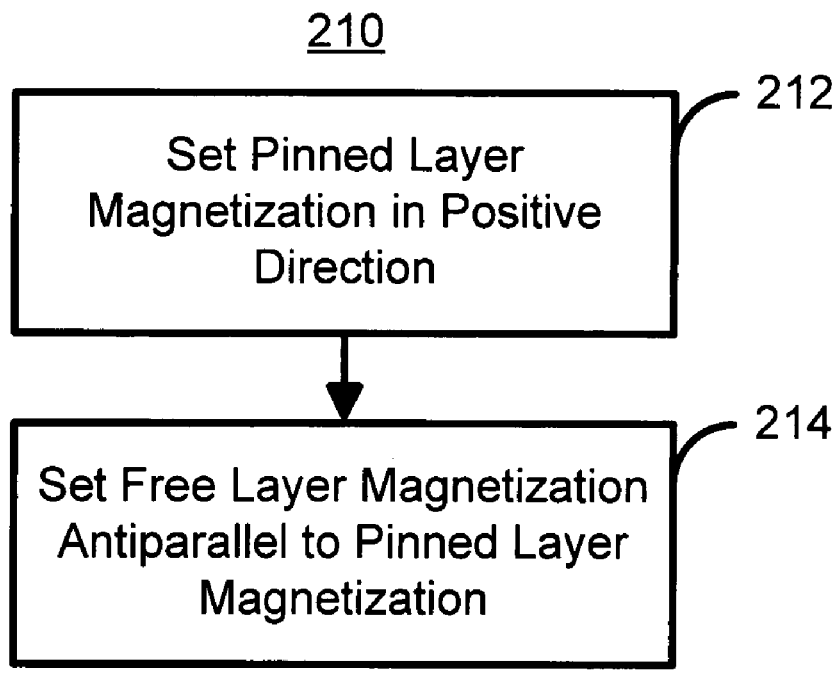
FIG. 5 is a high-level flow chart depicting one embodiment of a method in accordance with the present invention for configuring a magnetic logic cell for an AND operation.

More popular logic operations are the AND, OR, NOR, and NAND operations. Consequently, configuring the magnetic logic cell is described separately for these operations. FIG. 5 is a flow chart depicting one embodiment of a method 210 in accordance with the present invention for configuring a magnetic logic cell for an AND operation. The method 210 is described in the context of the magnetic logic cell 100. However, nothing prevents the use of the method 210 with another magnetic logic cell. For an AND operation, the pinned layer magnetization 115 is set in the positive direction, via step 212. Step 212 is performed by heating the magnetic element 110 until the AFM layer 112 is in a sufficiently disordered state to allow the pinned layer magnetization 115 to be set. Step 212 thus generally heats the AFM layer 112 to be at or above the blocking temperature. This heating is preferably accomplished in step 212 by driving the first current through the magnetic element 110. In addition, the second current is present in a positive direction, which generates a positive field at the pinned layer 114. Also in a preferred embodiment, the magnetic element 100 is cooled in the presence of the field and the first current used in heating the AFM layer 112 above the blocking temperature is stepped down in step 212. Thus, step 212 sets the magnetization 115 of the pinned layer 114 in the positive direction. The free layer magnetization 119 is initially set antiparallel to the pinned layer magnetization, via step 214. Step 214 is performed by driving the first and second currents through first and second configuration lines 120 and 130, respectively, in a negative direction. Thus, the initial state of the logical cell 100 would be a logical "0". The logical cell 100 could then accept inputs and function as an AND gate.

Figure 6:
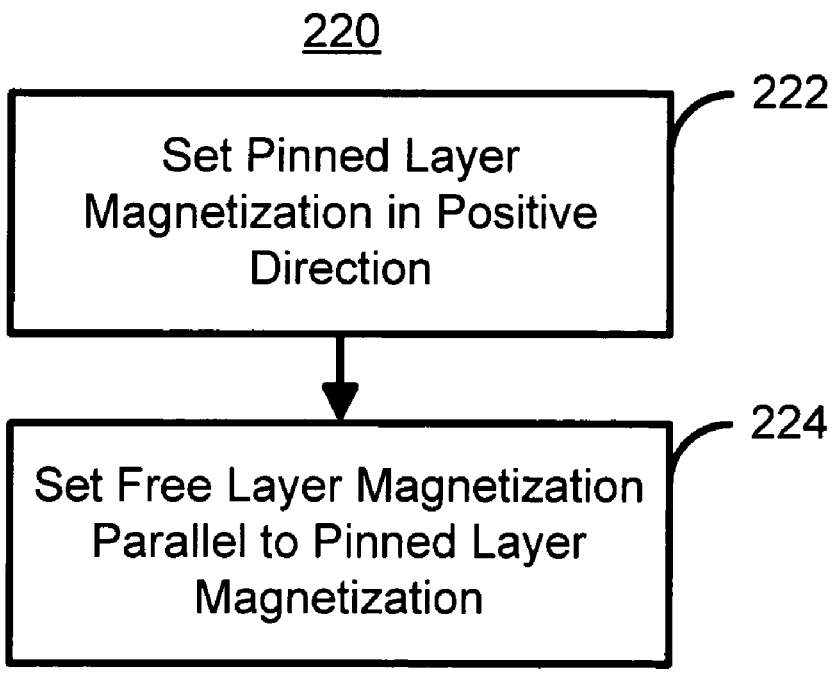
FIG. 6 is a high-level flow chart depicting one embodiment of a method in accordance with the present invention for configuring a magnetic logic cell for an OR operation.

FIG. 6 is a high-level flow chart depicting one embodiment of a method 220 in accordance with the present invention for configuring a magnetic logic cell for an OR operation. The method 220 is described in the context of the magnetic logic cell 100. However, nothing prevents the use of the method 220 with another magnetic logic cell. For an OR operation, the pinned layer magnetization 115 is set in the positive direction, via step 222. Step 222 is performed by heating the magnetic element 110 until the AFM layer 112 is at or above the blocking temperature. This heating is preferably accomplished in step 222 by driving the first current through the magnetic element 110. In addition, the second current is present in a positive direction, which generates a positive field at the pinned layer 114. Also in a preferred embodiment, the magnetic element 100 is cooled in the presence of the field and the first current used in heating the AFM layer 112 above the blocking temperature is stepped down in steps 222. Thus, step 222 sets the magnetization 115 of the pinned layer 114 in the positive direction. The free layer magnetization 119 is initially set parallel to the pinned layer magnetization, via step 224. Step 224 is performed by driving the first and second currents through first and second configuration lines 120 and 130, respectively, in a positive direction. Thus, the initial state of the logical cell 100 would be a logical "1". The logical cell 100 could then accept inputs and function as an OR gate.

Figure 7:
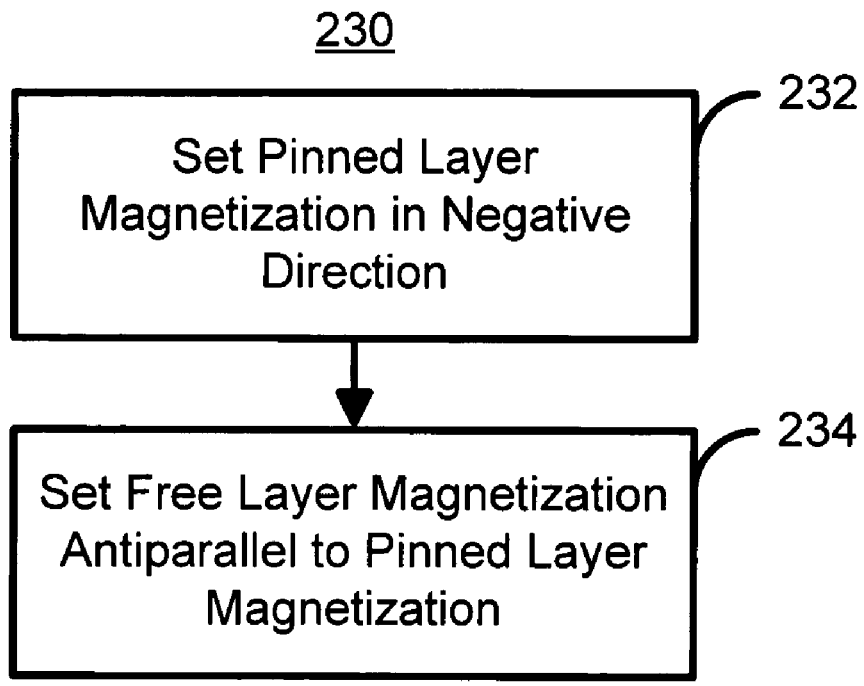
FIG. 7 is a high-level flow chart depicting one embodiment of a method in accordance with the present invention for configuring a magnetic logic cell for an NOR operation.

FIG. 7 is a high-level flow chart depicting one embodiment of a method 230 in accordance with the present invention for configuring a magnetic logic cell for a NOR operation. The method 230 is described in the context of the magnetic logic cell 100. However, nothing prevents the use of the method 230 with another magnetic logic cell. For a NOR operation, the pinned layer magnetization 115 is set in the negative direction, via step 232. Step 232 is performed by heating the magnetic element 110 until the AFM layer 112 is at or above the blocking temperature. This heating is preferably accomplished in step 232 by driving the first current through the magnetic element 110 in a negative direction. In addition, the second current is present in a negative direction, which generates a negative field at the pinned layer 114. Also in a preferred embodiment, the magnetic element 100 is cooled in the presence of the field and the first current used in heating the AFM layer 112 above the blocking temperature is stepped down in steps 232. Thus, step 232 sets the magnetization 115 of the pinned layer 114 in the negative direction. The free layer magnetization 119 is initially set antiparallel to the pinned layer magnetization, via step 234. Step 234 is performed by driving the first and second currents through first and second configuration lines 120 and 130, respectively, in a positive direction. Thus, the initial state of the logical cell 100 would be a logical "0". The logical cell 100 could then accept inputs and function as an NOR gate.

Figure 8:
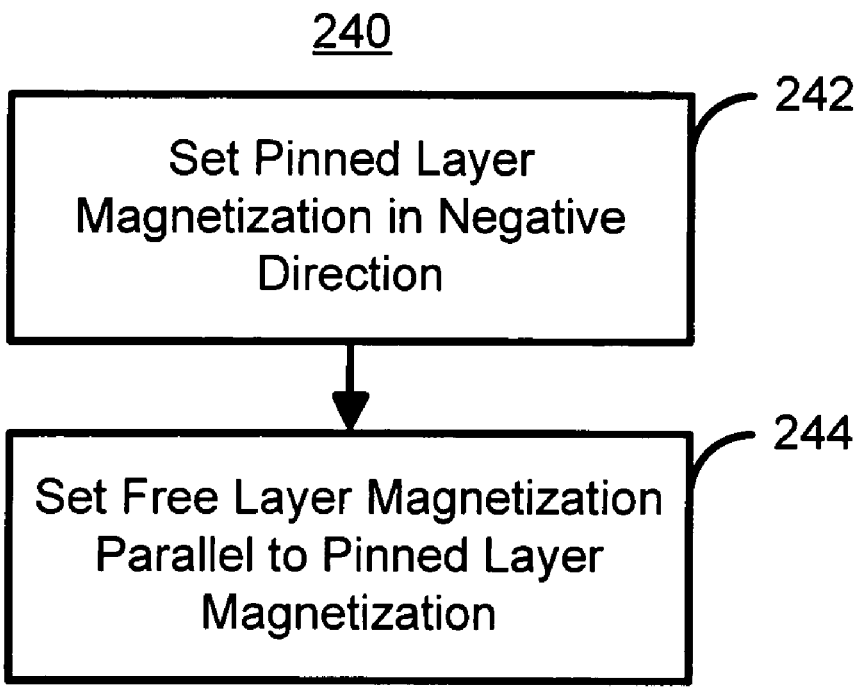
FIG. 8 is a high-level flow chart depicting one embodiment of a method in accordance with the present invention for configuring a magnetic logic cell for a NAND operation.

FIG. 8 is a high-level flow chart depicting one embodiment of a method 240 in accordance with the present invention for configuring a magnetic logic cell for a NAND operation. The method 240 is described in the context of the magnetic logic cell 100. However, nothing prevents the use of the method 240 with another magnetic logic cell. For a NAND operation, the pinned layer magnetization 115 is set in the negative direction, via step 242. Step 242 is performed by heating the magnetic element 110 until the AFM layer 112 is at or above the blocking temperature. This heating is preferably accomplished in step 242 by driving the first current through the magnetic element 110 in a negative direction. In addition, the second current is present in a negative direction, which generates a negative field at the pinned layer 114. Also in a preferred embodiment, the magnetic element 100 is cooled in the presence of the field and the first current used in heating the AFM layer 112 above the blocking temperature is stepped down in step 242. Thus, step 242 sets the magnetization 115 of the pinned layer 114 in the negative direction. The free layer magnetization 119 is initially set parallel to the pinned layer magnetization, via step 244. Step 244 is performed by driving the first and second currents through first and second configuration lines 120 and 130, respectively, in a negative direction. Thus, the initial state of the logical cell 100 would be a logical "1". The logical cell 100 could then accept inputs and function as an NAND gate.

Thus, the magnetic cell 110 can be configured and reconfigured to perform various operations. Moreover, configuring the magnetic logic cell 100 can be achieved simply by driving the appropriate currents through and in proximity to portions of the magnetic memory. In addition to being reconfigurable, the magnetic logic cell 100 uses only one magnetic element per cell. Consequently, density can be improved and manufacturing simplified. Table 2 summarizes the currents provided in configuring the magnetic logic cell. Note that in Table 2, line 120 corresponds to the first configuration line 120 and line 130 corresponds to the second configuration line 130.

TABLE 2

| Step | ORDER | AND First | AND Second | OR First | OR Second | NOR First | NOR Second | NAND First | NAND Second |
|---|---|---|---|---|---|---|---|---|---|
| Pinned Layer Setup | Line 120 | +I1 | +I1 | +I1 | +I1 | −I1 | −I1 | −I1 | −I1 |
| | Line 130 | +I2 | +I2 | +I2 | +I2 | −I2 | −I2 | −I2 | −I2 |
| | Trans. 140 | On | Off | On | Off | On | Off | On | Off |
| Free Layer Setup | Line 120 | −I1 | | +I1 | | +I1 | | −I1 | |
| | Line 130 | −I2 | | +I2 | | +I2 | | −I2 | |
| | Trans 140 | off | | off | | off | | off | |

Figure 9:
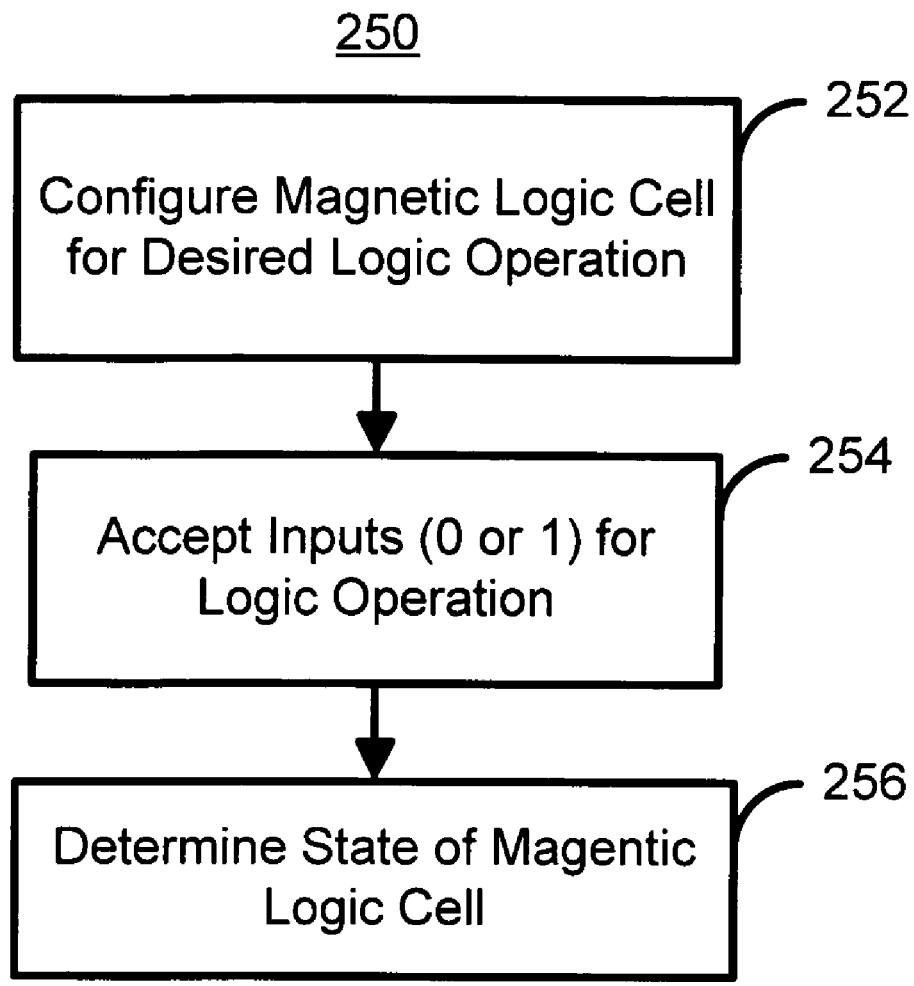
FIG. 9 is a high-level flow chart depicting one embodiment of a method in accordance with the present invention for configuring and utilizing a magnetic logic cell for a NAND operation.

FIG. 9 is a high-level flow chart depicting one embodiment of a method 250 in accordance with the present invention for configuring and utilizing a magnetic logic cell. However, nothing prevents the use of the method 250 with another magnetic logic cell. The method 200, 210, 220, 230, and/or 240 is used to configure the magnetic logic cell 100 to the desired logic operation, such as an AND, OR, NOR, or NAND, via step 252. Inputs are accepted, via step 254. Step 254 is preferably performed by providing the first and second currents over the first and second configuration lines 120 and 130, respectively, in the positive or negative direction. As a result, the magnetization 119 of the free layer 118 may switch. The state of the magnetic element 110 is determined, via step 256. Step 256 is preferably performed by turning the transistor 140 on and driving a read current through the magnetic element 110 and determining whether the magnetic element 110 is in a high or a low resistance state. Depending upon the state of the magnetic element 110, the resultant of the logic operation can be determined.

Thus, the magnetic logic cell 100 can be configured (and reconfigured) to provide a number of different logic operations. In addition to being reconfigurable, the magnetic logic cell 100 uses only one magnetic element per cell. Consequently, density can be improved and manufacturing simplified.

A method and system for providing a reconfigurable magnetic logic cell has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic logic cell comprising;
a magnetic element including a pinned layer, a free layer, and a spacer layer, the pinned layer having a pinned layer magnetization; the free layer having a free layer magnetization, the spacer layer residing between the pinned layer and the free layer;
a first configuration line electrically connected to the magnetic element, the first configuration line for carrying a first current;
a second configuration line electrically insulated from the magnetic element and from the first configuration line, the second configuration line for carrying a second current, the first current and the second current alone incapable of switching the free layer magnetization, the first current and the second current together in a particular direction capable of switching the free layer magnetization, and wherein the first current driven through the magnetic element and the second current capable of setting the pinned layer magnetization to a pinned layer magnetization direction.

2. The logic cell of claim 1 wherein the magnetic element further includes;
an antiferromagnetic layer adjacent to the pinned layer, the antiferromagnetic layer having a blocking temperature such that the first current driven through the magnetic element is capable of heating the antiferromagnetic layer to at least the blocking temperature.

3. The logic cell of claim 2 wherein the antiferromagnetic layer includes IrMn.

4. The logic cell of claim 2 wherein the antiferromagnetic layer has a blocking temperature of between one hundred and two hundred degrees Celsius.

5. The logic cell of claim 2 further comprising:
a transistor coupled to the magnetic element such that the first current is driven through the magnetic element when the transistor is in a first set.

6. The logic cell of claim 2 wherein the logic cell performs an AND operation, wherein the pinned layer magnetization direction is antiparallel to an initial direction of the free layer magnetization, and wherein the pinned layer magnetization direction is a positive direction.

7. The logic cell of claim 2 wherein the logic cell performs an OR operation, and wherein the pinned layer magnetization direction is parallel to the initial direction of the free layer and wherein the pinned layer magnetization direction is a positive direction.

8. The logic cell of claim 2 wherein the logic cell performs an NOR operation, and wherein the pinned layer magnetization direction is antiparallel to the initial direction of the free layer and wherein the pinned layer magnetization direction is a negative direction.

9. The logic cell of claim 2 wherein the logic cell performs an NAND operation, and wherein the pinned layer magnetization direction is parallel to the initial direction of the free layer and wherein the pinned layer magnetization direction is a negative direction.

10. The logic cell of claim 2 wherein the spacer layer is a current confined layer.

11. The logic cell of claim 10 wherein the magnetic element is a ballistic magnetoresistive element.

12. The logic cell of claim 2 wherein the spacer layer is a tunneling barrier.

13. A magnetic logic array comprising:
a plurality of magnetic logic cells, each of the plurality of magnetic logic cells including a magnetic element having a pinned layer, a free layer, and a spacer layer, the pinned layer having a pinned layer magnetization; the free layer having a free layer magnetization, the spacer layer residing between the pinned layer and the free layer;
a plurality of first configuration lines, each of the plurality of first configuration lines electrically connected to the magnetic element of a first portion of the plurality of magnetic logic cells, the first configuration line for carrying a first current having a first current magnitude;
a plurality of second configuration lines, each of the plurality of second configuration lines electrically insulated from the magnetic element and from the first configuration line of a second portion of the plurality of magnetic logic cells, the second configuration line for carrying a second current having a second current magnitude, the first current and the second current alone incapable of switching the free layer magnetization, the first current and the second current together in a particular direction capable of switching the free layer magnetization, and wherein the first current driven through the magnetic element and the second current capable of setting the pinned layer magnetization to a pinned layer magnetization direction.

14. The magnetic logic array of claim 13 wherein a first configuration line of the plurality of first configuration lines corresponds to a corresponding second configuration line of the plurality of second configuration lines, the first configuration line and the corresponding second configuration line being parallel only when directly aligned with a magnetic logic cell of the plurality of magnetic logic cells.

15. The magnetic logic array of claim 13 wherein each of the plurality of magnetic logic cells is separately selectable.

16. A method for configuring a magnetic logic cell for a particular operation, the magnetic logic cell including a magnetic element having a pinned layer, a free layer, and a spacer layer, the pinned layer having a pinned layer magnetization; the free layer having a free layer magnetization, the spacer layer residing between the pinned layer and the free layer, and comprising;
setting pinned layer magnetization direction by driving a first current from through the magnetic element and driving a second current in proximity to the magnetic element that generates a magnetic field to set the pinned layer magnetization to a pinned layer magnetization direction;

setting an initial direction for the free layer magnetization by driving the first current and the second current in a particular direction.

17. The method of claim 16 wherein the magnetic element further includes an antiferromagnetic layer adjacent to the pinned layer, the antiferromagnetic layer having a blocking temperature such that the first current driven through the magnetic element is capable of heating the antiferromagnetic layer to at least the blocking temperature.

18. The method of claim 17 wherein the logic cell performs an AND operation, wherein the pinned layer magnetization direction setting step sets the pinned layer to a positive direction by driving the second current such that a magnetic field is provided in the positive direction at the pinned layer and wherein the initial direction setting step sets the free layer magnetization antiparallel to the pinned layer magnetization direction.

19. The method of claim 17 wherein the logic cell performs an OR operation, wherein the pinned layer magnetization direction setting step sets the pinned layer to a positive direction by driving the second current such that a magnetic field is provided in the positive direction at the pinned layer and wherein the initial direction setting step sets the free layer magnetization direction parallel to the pinned layer magnetization direction.

20. The method of claim 17 wherein the logic cell performs an NOR operation, wherein the pinned layer magnetization direction setting step sets the pinned layer to a negative direction by driving the second current such that a magnetic field is provided in the negative direction at the pinned layer and wherein the initial direction setting step sets the free layer magnetization direction antiparallel to the pinned layer magnetization direction.

21. The method of claim 17 wherein the logic cell performs an NAND operation, wherein the pinned layer magnetization direction setting step sets the pinned layer to a negative direction by driving the second current such that a magnetic field is provided in the negative direction at the pinned layer and wherein the initial direction setting step sets the free layer magnetization direction parallel to the pinned layer magnetization direction.

22. A magnetic logic cell comprising;
   a pinned layer having a pinned layer magnetization;
   a free layer having a free layer magnetization;
   a spacer layer residing between the pinned layer and the free layer; and
   an antiferromagnetic layer having a blocking temperature such that a first current driven through the magnetic element heats the antiferromagnetic layer to be in a sufficiently disordered state that the pinned layer magnetization can be set in a pinned layer magnetization direction;
   wherein the first current alone is insufficient to switch the free layer magnetization.

23. The magnetic logic cell of claim 22 wherein a second configuration line electrically insulated from the magnetic element carries a second current alone incapable of switching the free layer magnetization, the first current and the second current together in a particular direction capable of switching the free layer magnetization, and wherein the first current driven through the magnetic element and the second current capable of setting the pinned layer magnetization to a pinned layer magnetization direction.

24. The magnetic logic cell of claim 22 wherein the first current heats the antiferromagnetic layer to at or above the blocking temperature.

* * * * *